United States Patent
Sahara

(10) Patent No.: US 9,130,578 B2
(45) Date of Patent: Sep. 8, 2015

(54) PLL CIRCUIT

(71) Applicant: Yamaha Corporation, Hamamatsu-shi, Shizuoka-ken (JP)

(72) Inventor: Takuya Sahara, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 0 days.

(21) Appl. No.: 14/224,705

(22) Filed: Mar. 25, 2014

(65) Prior Publication Data

US 2014/0285246 A1  Sep. 25, 2014

(30) Foreign Application Priority Data

Mar. 25, 2013 (JP) ................... 2013-062078

(51) Int. Cl.
*H03L 7/06* (2006.01)
*H03L 7/08* (2006.01)

(52) U.S. Cl.
CPC ....................... *H03L 7/08* (2013.01)

(58) Field of Classification Search
USPC .......... 327/144, 147, 150, 156, 159; 375/375, 375/376
See application file for complete search history.

(56) References Cited

U.S. PATENT DOCUMENTS

| 7,940,097 | B2 * | 5/2011 | Chen ............................. | 327/158 |
| 8,171,335 | B2 * | 5/2012 | Tsai ............................. | 327/156 |
| 2003/0117195 | A1 * | 6/2003 | Chang .......................... | 327/159 |
| 2011/0304357 | A1 | 12/2011 | Tokairin | |

FOREIGN PATENT DOCUMENTS

| JP | 2001-126411 A | 5/2001 |
| JP | 4606533 B2 | 10/2010 |
| JP | 2012-109824 A | 6/2012 |
| WO | WO-2010/104164 A1 | 9/2010 |

OTHER PUBLICATIONS

Lee, J.Y. et al. (Aug. 2012). "A 4-GHz All Digital PLL With Low-Power TDC and Phase-Error Compensation," IEEE Transactions on Circuits and Systems I: Regular Papers, U.S.A. IEEE, vol. 59, No. 8, pp. 1706-1719.
Notification of Reason(s) for Refusal dated Apr. 1, 2015, for JP Patent Application No. 2013-062078, with English translation, six pages.

* cited by examiner

*Primary Examiner* — Long Nguyen
(74) *Attorney, Agent, or Firm* — Morrison & Foerster LLP

(57) ABSTRACT

A PLL circuit that operates in synchronization with an operating clock and generates and outputs a generated clock in synchronization with an external clock, including a multi-phase clock generating unit that generates multi-phase clocks including n clocks which have a same frequency and differ in phase one another, one of the clocks in the multi-phase clock being the operating clock, a frequency signal generating unit that outputs a frequency signal based on a phase difference signal from a phase comparator, an oscillating unit that generates and outputs a clock oscillating with a frequency corresponding to the frequency signal, and the phase comparator that measures a time difference between rising times or falling times of the inputted external clock and the oscillating unit based on the n clocks in the multi-phase clocks, and outputs a phase difference signal indicating the time difference based on a result of the measurement.

10 Claims, 5 Drawing Sheets

PLL CIRCUIT

TECHNICAL FIELD

The invention relates to a PLL circuit capable of detecting a phase difference with higher accuracy than normal accuracy determined by an operating clock.

BACKGROUND ART

A PLL (Phase Locked Loop) circuit is an electronic circuit which generates and outputs a signal whose phase is in synchronization with an inputted cyclic signal. PTL1 listed below discloses a digital PLL circuit for audio which continues operation by switching a reference clock to an internal clock when an external clock changes.

CITATION LIST

Patent Literature

{PTL1} JP 4606533 B2

SUMMARY OF INVENTION

Technical Problem

In a digital PLL (All Digital Phase-locked Loop (ADPLL) in particular) provided as an integrated circuit formed on a semiconductor, a logic circuit constituting this digital PLL operates with one operating clock being its time unit. In this case, detection accuracy of phase difference depends on frequency of the operating clock. For example, when the operating clock is 100 MHz, a time resolution thereof is $1/100000000=10$ ns. Then, by increasing the detection accuracy of phase difference, jitter of the digital PLL can be decreased.

However, in an integrated circuit, the maximum frequency of operable operating clock is determined according to the manufacturing process thereof, and it is uneasy to increase frequency of the operating clock more than that. Therefore, also for the detection accuracy of phase difference of the digital PLL, the accuracy corresponding to the upper limit frequency of the operating clock is an upper limit.

It is an object of the present invention to provide a digital PLL capable of detecting a phase difference with higher accuracy than normal accuracy determined by the operating clock.

Solution to Problem

To attain the above object, a PLL circuit according to the invention is a PLL circuit that operates in synchronization with an operating clock and generates and outputs a generated clock in synchronization with an external clock, which is an inputted clock signal having substantially constant cycles, the PLL circuit comprising: a multi-phase clock generating unit that generates multi-phase clocks including n clocks which have a same frequency and differ in phase one another, one of the clocks in the multi-phase clock being the operating clock; a frequency signal generating unit that outputs a frequency signal based on a phase difference signal from a phase comparator; an oscillating unit that generates and outputs a clock oscillating with a frequency corresponding to the frequency signal; and the phase comparator that measures, based on the n clocks in the multi-phase clocks, a time difference between a rising time of the inputted external clock and a rising time of the clock generated in the oscillating unit or a time difference between a falling time of the inputted external clock and a falling time of the clock generated in the oscillating unit, and outputs a phase difference signal indicating the time difference based on a result of the measurement.

Another PLL circuit according to the invention is a PLL circuit that operates in synchronization with an operating clock and generates and outputs a generated clock in synchronization with an external clock, which is an inputted clock signal having substantially constant cycles, the PLL circuit comprising: a multi-phase clock generating unit that generates multi-phase clocks including n clocks which have a same frequency and differ in phase one another, one of the clocks in the multi-phase clock being the operating clock; a frequency number signal generating unit that outputs a frequency number with a value based on a phase difference signal from a phase comparator; an oscillating unit that generates and outputs a clock oscillating with a frequency corresponding to the frequency number by accumulating the frequency number at respective timings of the operating clock; and the phase comparator that measures, based on the n clocks in the multi-phase clocks, a time difference between a rising time of the inputted external clock and a rising time of the clock generated in the oscillating unit or a time difference between a falling time of the inputted external clock and a falling time of the clock generated in the oscillating unit, and outputs a phase difference signal indicating a time difference expressed with time accuracy of n-fold of the operating clock based on a result of the measurement.

In the above PLL circuits, it is conceivable that the phase comparator converts a waveform including a clock generated in the oscillating unit into an analog signal, and measures the time difference using a clock obtained by binarizing the analog signal.

Further, it is also conceivable that the phase comparator measures the rising or falling timing of the external clock based on the n clocks in the multi-phase clocks, measures the rising or falling timing of the generated clock based on an accumulated value at a time when the clock is generated in the oscillating unit, and obtains the time difference from difference between the two timings.

Advantageous Effects of Invention

According to the present invention, times and timings of a clock are measured using multi-phase clocks including n clocks which have the same frequency and differ in phase. Thus, a phase difference between an external clock and a generated clock can be detected with time accuracy higher than an operating clock, and a stable clock can be generated.

DESCRIPTION OF EMBODIMENTS

Hereinafter, embodiments of the present invention will be described using the drawings.

Figure 1:
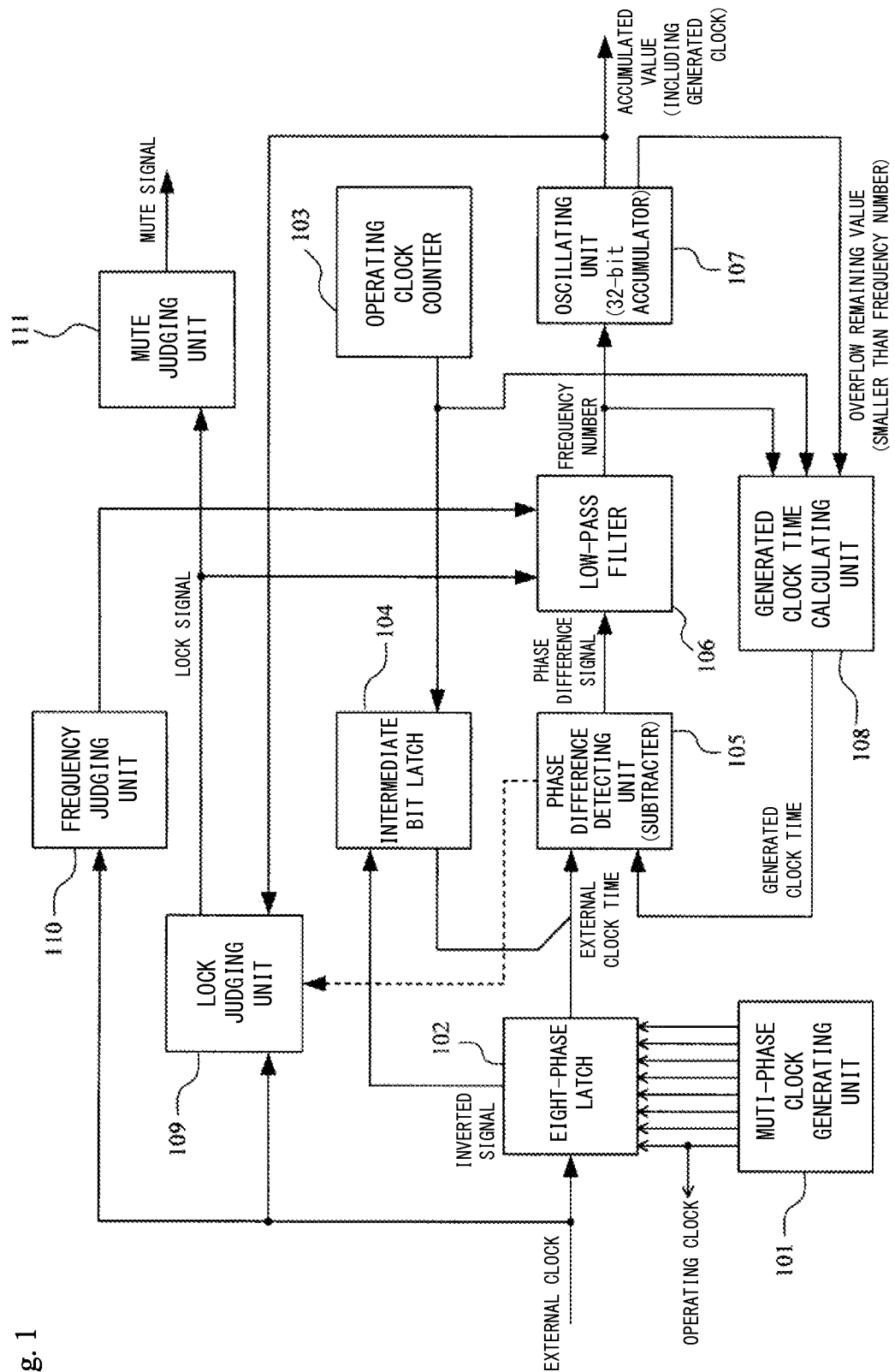
FIG. 1 is a structural diagram of a PLL circuit which is a first embodiment of the invention.
Figure 2:
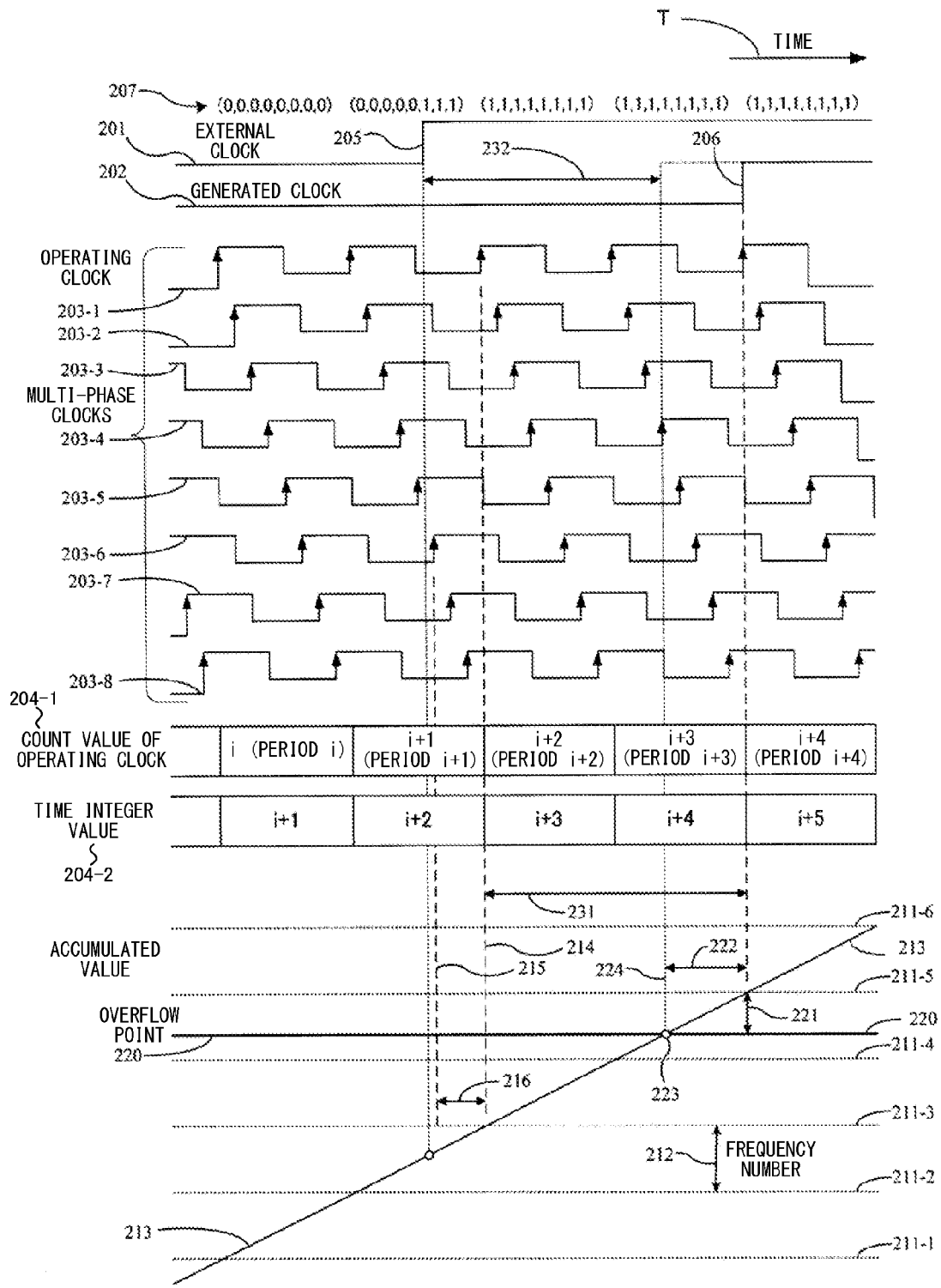
FIG. 2 is a diagram illustrating signal timings of respective parts in the PLL circuit of the first embodiment.

FIG. 1 is a structural diagram of the PLL circuit which is a first embodiment of the present invention. This PLL circuit is an all-digital phase locked loop (ADPLL) in which all circuits are digital. FIG. 2 is an explanatory diagram of timings of respective parts and the like in the PLL circuit of FIG. 1. Overviews of functions of respective parts of this PLL circuit will be described first with reference to FIG. 1, and thereafter details of operations of respective parts will be described with reference to FIG. 2.

In FIG. 1, a multi-phase clock generating unit 101 generates multi-phase clocks including eight clocks which have the same frequency but differ in phase from each other. One of the eight clocks in the multi-phase clocks is used as an operating clock. The operating clock is supplied to respective parts in this circuit, and the respective parts in the circuit perform their respective operations with reference to timings of this operating clock. Among the eight clocks in the multi-phase clocks, the clock to be used as the operating clock is called first clock, from which the others are called second clock, third clock, . . . , eighth clock in the order of phase shift (temporal order of rising or falling timing of the clocks). Phase difference between the first clock and the second clock, phase difference between the second clock and the third clock, . . . , and phase difference between the eighth clock and the next first clock are all the same.

An eight-phase latch 102 latches an inputted external clock at the timing of each rising of the first to eighth clocks from the multi-phase clock generating unit 101. The latch result is expressed by a numeral string of eight 1's or 0's. For example, when value of the external clock is "0" at a rising timing of the first clock, value of the external clock is "0" at a rising timing of the second clock, and so on, and value of the external clock is "0" at a rising timing of the last eighth clock, the latch result thereof is expressed as (0, 0, 0, 0, 0, 0, 0, 0) with those values being arranged in order. For example, the latch result is (0, 0, 0, 0, 0, 1, 1, 1) when value of the external clock is "0" at respective rising timings of the first to fifth clocks, the external clock rises to "1" between a rise of the fifth clock and a rise of the sixth clock, and value of the external clock is "1" at respective rising timings of the sixth to the eighth clocks.

An operating clock counter 103 is a counter which counts up sequentially at a rising timing of the operating clock, and outputs a count value thereof (=time integer value−1). The "count value (=time integer value−1)" means that when, for example, value of the operating clock counter 103 is "i" in one cycle from a certain rising timing to a next rising timing of the operating clock, a time integer value identifying this one cycle is "i+1". The operating clock counter 103 is a 16-bit counter here. Upon detection of rising from "0" to "1" of the inputted external clock, the eight-phase latch 102 outputs an inverted signal at the next rising timing of the operating clock. When this inverted signal is outputted, an intermediate bit latch 104 latches the value of the operating clock counter 103 at the next falling timing of the operating clock. The count value latched by the intermediate bit latch 104 represents the time of rising timing of the external clock in resolution by the operating clock.

On the other hand, when the external clock rises from "0" to "1" at any timing in one cycle of a certain operating clock, the inverted signal is outputted at the timing of end (end edge) of one cycle of this operating clock, and at that time, the latch result in the eight-phase latch 102 is any one of the following eight results [0] to [7].

[0] (0, 0, 0, 0, 0, 0, 0, 0)
[1] (0, 0, 0, 0, 0, 0, 0, 1)
[2] (0, 0, 0, 0, 0, 0, 1, 1)
[3] (0, 0, 0, 0, 0, 1, 1, 1)
[4] (0, 0, 0, 0, 1, 1, 1, 1)
[5] (0, 0, 0, 1, 1, 1, 1, 1)
[6] (0, 0, 1, 1, 1, 1, 1, 1)
[7] (0, 1, 1, 1, 1, 1, 1, 1)

Details will be described with the timing chart of FIG. 2. These [0] to [7] indicate where the external clock rises from "0" to "1" in divided periods of equally dividing one cycle of the operating clock into eight. Then, in one cycle next to a cycle where there is a rise of the external clock, the eight-phase latch 102 outputs, as 3-bit data corresponding to the respective latch results, 000B (0 in decimal) when it is [0], 001B (1 in decimal) when it is [1], 010B (2 in decimal) when it is [2], 011B (3 in decimal) when it is [3], 100B (4 in decimal) when it is [4], 101B (5 in decimal) when it is [5], 110B (6 in decimal) when it is [6], and 111B (7 in decimal) when it is [7]. The 3-bit data are a difference value expressing a time difference (fractional value) of rising timing of the external clock in resolution of equally dividing one cycle of the operating clock into eight.

Describing in detail, it means that the external clock has risen from "0" to "1" in the divided period gone back by the value of the 3-bit data from the end time of the one cycle where there is a rise of the external clock (that is, the start end of the one cycle where a latch is performed in the intermediate bit latch 104). For example, the above case of [0] illustrates that the external clock has risen from "0" to "1" in the last divided period (it is between the eighth clock and the next first clock and is the eighth divided period counted from the beginning) among the periods dividing one cycle of the operating clock where there was the rise of the external clock into eight. The above case of "1" illustrates that the external clock has risen from "0" to "1" in the seventh divided period (it is between the seventh clock and the eighth clock) among the periods dividing one cycle of the operating clock where there was the rise of the external clock into eight.

Then, by obtaining a time integer value identifying the one cycle where there was the rise of the external clock and coupling this time integer value and a time fractional value obtained by bit-inverting the 3-bit data, a time gone forward by the bit-inverted time fractional value from the beginning time of the one cycle identified by this time integer value (time gone back by the difference value indicated by the 3-bit data from the end time of this cycle), that is, a rising time of the external clock (external clock time) having an eight-fold resolution of the operating clock can be obtained. Now, the "processing to obtain the time integer value identifying one cycle where there was a rise of the external clock" is such that the count value latched by the intermediate bit latch 104 is merely taken as it is as the time integer value. This is because there is a relation "count value=time integer value−1", and latching of the count value by the intermediate bit latch 104 is performed in the next cycle of a cycle where there was a rise of the external clock. Further, the bit inversion is performed by the eight-phase latch 102. This external clock time is inputted to a phase difference detecting unit 105.

An oscillating unit 107 is a 32-bit accumulator which accumulates the frequency number outputted from a low-pass filter (frequency signal generating unit) 106 at every rising timing of the operating clock. As the frequency number is accumulated, an overflow (overflow exceeding 32 bits of the accumulator) occurs at certain timing, and thus an accumulated value which is an output of the oscillating unit 107 becomes a saw-tooth waveform. A period from a fall to a rise of this saw-tooth becomes one cycle of a generated clock.

To a generated clock time calculating unit 108, the count value from the operating clock counter 103, the frequency number from the low-pass filter 106, and an overflow remaining value from the oscillating unit 107 are inputted. The "overflow remaining value" from the oscillating unit 107 is a value of the accumulator when the accumulated value of the oscillating unit 107 overflows. The overflow occurs by accumulating the frequency number, and thus the overflow remaining value is a value smaller than the frequency number.

Since the oscillating unit 107 accumulates the frequency number at every rising timing of the operating clock, it actually increases stepwise. However, when it is considered that it virtually increases continuously and smoothly, an occurrence of overflow of the accumulated value of the oscillating unit 107 at a certain rising timing of the operating clock means that a "virtual overflow point" exists in the period of one cycle from the last rising timing of the operating clock to the rising timing of the operating clock where the overflow is detected. Here, the "virtual" means that it is an overflow point obtained by assuming that the accumulated value that is actually increasing stepwise is virtually smooth. However, thinking inversely, this "virtual overflow point" is the "true overflow point" whose time should be really obtained, and the rising timing of the operating clock where the overflow is detected can be said as an "apparent overflow point". Then this also means that the accumulator of the oscillating unit 107 has increased by the overflow remaining value in the period from the "true overflow point" to the "apparent overflow point". Since the value of the frequency number is accumulated by one cycle of the operating clock, a time amount taken for increase by the amount of the overflow remaining value can be recognized by proportionally distributing the value. The time gone back by that time amount from the timing of "apparent overflow point" is the time of "true overflow point" and this "true overflow point" is used as a generated clock time that is the rising timing of the generated clock. Note that the going back time from the "apparent overflow point" which is the rising timing of the operating clock where the overflow is detected to the "true overflow point" is called an "overflow point going back time".

The generated clock time calculating unit 108 calculates the generated clock time. Specifically, first, the generated clock time calculating unit 108 obtains a count value (=time integer value−1) of the operating clock counter 103 at a rising timing (apparent overflow point) of the operating clock where an overflow is detected. Since the obtainment of this count value is carried out in (at the beginning of) the next cycle of the one cycle of the operating clock to which the generated clock time belongs, which is the true overflow point, and the count value=time integer value−1, the count value obtained here is the time integer value of the one cycle of the operating clock to which the generated clock time belongs. Next, the generated clock time calculating unit 108 divides the overflow remaining value from the oscillating unit 107 by the frequency number to obtain the overflow point going back time (difference value). Moreover, the time fractional value obtained by bit-inverting three high-order bits of the overflow point going back time is coupled to the obtained time integer value. Thus, a time gone forward by the time fractional value obtained by bit-inverting three high-order bits of the overflow point going back time from the beginning time of the one cycle including the true overflow point (time gone back by the difference value indicated by three high-order bits of the overflow point going back time from the end time of the one cycle), that is, a rising time (generated clock time) of the generated clock having an eight-fold resolution of the operating clock.

Note that although calculation of the overflow point going back time can be performed with high accuracy, since the external clock time is expressed in resolution dividing one cycle of the operating clock into eight as described above, the overflow point going back time is calculated by approximately the same accuracy (three bits).

Note that when the oscillating unit 107 is of 32 bit length (31st bit to 0th bit), it is possible to correspond to the range of 192 kHz if the frequency number is 22 bits (21st bit to 0th bit). In this case, the three bits for expressing the overflow point going back time (three low-order bits of the generated clock time) may be calculated based on 16 intermediate bits (21st bit to sixth bit) among the 32 bits of output of the oscillating unit 107 and 16 high-order bits (21st bit to sixth bit) of the frequency number.

The phase difference detecting unit (phase comparator) 105 calculates the phase difference signal based on the external clock time and the generated clock time. Specifically, the phase difference detecting unit 105 outputs a value obtained by subtracting the generated clock time from the external clock time as the phase difference signal. The phase difference signal outputted here is the range of a negative ½ cycle length to a positive ½ cycle length (this "cycle length" is a cycle length of the external clock or the generated clock). Note that when the generated clock time occurs plural times while the external clock time does not occur, this means that the frequency of the generated clock is too high, and thus a predetermined value equal to or more than the positive ½ cycle length may be outputted as the phase difference signal instead of the value obtained by the subtraction. Conversely, when the external clock time occurs plural times while the generated clock time does not occur, this means that the frequency of the generated clock is too low, and thus a predetermined value equal to or less than the negative ½ cycle length may be outputted as the phase difference signal instead of the value obtained by the subtraction. The low-pass filter 106 increases or decreases the present frequency number based on the phase difference signal so that the phase difference decreases (that is, the external clock time and the generated clock time become close). Specifically, when the phase difference obtained by subtracting the generated clock time from the external clock time is a positive value, it means that the generated clock time is earlier than the external clock time, and thus the low-pass filter 106 decreases the frequency number by a value corresponding to the phase difference signal so as to delay the generated clock time. Conversely, when the phase difference obtained by subtracting the generated clock time from the external clock time is a negative value, it means that the generated clock time is later than the external clock time, and thus the low-pass filter 106 increases the frequency number by a value corresponding to the phase difference signal so as to advance the generated clock time.

A frequency judging unit 110 accepts a specification of one or more frequencies to be followed, such as 44.1 kHz, 48 kHz, 96 kHz, in advance, detects frequency of an inputted external clock, and outputs, when it is in the range of the specified frequency, an initial value of the frequency number corresponding to the detected frequency to the low-pass filter 106. The low-pass filter 106 starts operation of synchronization from the frequency number of the initial value.

A lock judging unit 109 judges whether or not a variation of the timing difference between the above-described generated clock and the external clock is equal to or less than a predetermined value, that is, whether or not the generated clock locks on (synchronized with) the external clock. Instead of comparing directly, it may be judged based on the phase difference signal outputted by the phase difference detecting unit 105. The lock judging unit 109 outputs a lock signal "1" when a continuous synchronization is confirmed over plural clocks, or otherwise outputs a lock signal "0". While the lock signal "0" is inputted (this means that absolute value of phase difference between the generated clock and the external clock is large), the low-pass filter 106 changes the time constant of the low-pass filter to change the frequency number relatively largely so that the generated clock time gets close to the external clock time as soon as possible. Conversely, while the lock signal "1" is inputted (this means that absolute value of phase difference between the generated clock and the external clock is small and the generated clock is synchronized with the external clock), the low-pass filter 106 changes the time constant of the low-pass filter so that the generated clock time slowly follows the external clock.

Note that in this embodiment, even after the lock is affected, the operation to detect the phase difference between the external clock and the generated clock and control the frequency number based on the phase difference is continued. However, after the lock is affected, it may be configured to keep outputting the generated clock of the frequency at the time of locking even when the external clock is not inputted.

A mute judging unit 111 outputs a mute signal of "0" to release a mute of an audio signal while the lock signal "1" is inputted from the lock judging unit 109, or outputs a mute signal of "1" instructing the mute of the audio signal while the lock signal "0" is inputted. This mute signal is used in an audio device of FIG. 5, which will be described later.

With reference to the timing chart of FIG. 2, timings of respective signals in the PLL circuit of FIG. 1 will be described.

An arrow T denotes an elapsing direction of time. 201 denotes the external clock, and 202 denotes the generated clock. 203-1 to 203-8 denote the eight clocks in the multi-phase clocks generated by the multi-phase clock generating unit 101 in the order of first to eighth clocks. 203-1 is the operating clock. 204-1 denotes the count value of the operating clock counter 103. 204-2 denotes the time integer value identifying each cycle of the operating clock. The count value 204-1 is counted up as i, i+1, i+2, . . . every time the operating clock rises. Respective periods identified by these count values 204-1 are called period i, period i+1, period i+2, and so on. 205 is a rising timing of the external clock, and 206 is a rising timing of the generated clock.

207 denotes in order a latch result of the eight-phase latch 102 in the period i, a latch result of the eight-phase latch 102 in the period i+1, and so on. The external clock 201 is "0" all the time in the period i, and thus the latch result is (0, 0, 0, 0, 0, 0, 0, 0). In the period i+1, the external clock 201 rises to "1" between a rise of the fifth clock and a rise of the sixth clock among the multi-phase clocks, and thus the latch result is (0, 0, 0, 0, 0, 1, 1, 1). In the periods i+2, i+3, and i+4, the external clock 201 is "1" all the time, and thus the latch result is (1, 1, 1, 1, 1, 1, 1, 1).

Dotted lines 211-1 to 211-6 on a lower part of the chart illustrate how the accumulated value increases. Spaces between these dotted lines correspond to the frequency number 212. 213 denotes the accumulated value outputted from the oscillating unit 107. This accumulated number 213 is in practice a stepwise graph increasing by the frequency number at every rising timing of the operating clock 203-1, but here it is represented as a graph 213 which increases virtually continuously and smoothly.

A method of obtaining the external clock time which is the time of rising timing 205 of the external clock will be described. Now, the external clock rises during the period i+1, the eight-phase latch 102 outputs an inverted signal at the beginning timing 214 of the next period i+2, and the intermediate bit latch 104 latches the count value i+2 at the falling timing (middle of the period i+2) of the next operating clock in response to the inverted signal. Further, since the external clock rises between the fifth clock and the sixth clock of the period i+1 (timing 205), the eight-phase latch 102 outputs 3-bit data 011B (3 in decimal) corresponding to the latch result thereof (0, 0, 0, 0, 0, 1, 1, 1) in the period i+2. This 3-bit data 011B (3 in decimal) indicates a going back value from the timing 214 to the rising timing 205 of the external clock, that is, the time denoted by 216.

As described above, by taking the value latched by the intermediate bit latch 104 in the period i+2 as the time integer i+2 as it is, and further adding the time fractional value 100B (4 in decimal) obtained by inverting the 3-bit data 011B (value latched by the eight-phase latch, 3 in decimal) corresponding to the period 216 to the low-order bits of the time integer, the rising time of the external clock, that is, the timing 215 can be calculated. Note that the time fractional value 100B obtained by inverting the 3-bit data 011B corresponding to the period 216 is equivalent to the time from the beginning end of the period i+1 to the timing 215 (to be precise, the rising timing 205 of the external clock 201 is rounded to the rising timing 215 of the sixth clock in the expression of the 3-bit data, whereas in the expression of inverting the 3-bit data, the rising timing 205 of the external clock is rounded to the rising timing of the fifth clock, and thus there is a deviation of this amount). The time of the timing 215 obtained as above is inputted to the phase difference detecting unit 105 as an external clock time.

Next, a method of obtaining a generated clock time which is a time of the (true) rising timing 223 of the generated clock will be described. The (apparent) rise timing 206 of the generated clock outputted from the oscillating unit 107 is of a resolution rounded to the resolution of the operating clock, but the (true) rise timing 223 of the generated clock is the timing gone back from the rise timing 206 by the "overflow remaining value" remaining in the accumulator at this point. Now, it is assumed that an overflow of the oscillating unit 107 is detected at the timing of beginning end 206 of the period i+4. 220 denotes the level at which the accumulated value of the oscillating unit 107 exceeds the maximum value and returns to "0" (level of overflow point). The arrow 221 denotes the "overflow remaining value" remaining in the accumulator of the oscillating unit 107 at the timing 206 where the overflow is detected. 213 is a graph of virtual accumulated values such that accumulated values of the oscillating unit 107 at rising timings (beginning of each period) of the operating clock are connected by a straight line and smoothed. The timing 224 at which this virtual accumulated value 213 traverses the level 220 of the overflow point should be the timing of true rising of the generated clock. The apparent accumulated value 213 increases by the frequency number 212 in one cycle of the operating clock, and thus a time 222 can be obtained by dividing the "overflow remaining value" 221 by the frequency number. This time 222 is the "overflow point going back time" described in FIG. 1, and here only three high-order bits thereof are used so as to obtain the same time resolution as the external clock time.

Thus, the (true) rise timing (overflow point 223) of the generated clock, that is, time of the timing 224 can be calculated by taking the operating clock counter value i+4 indicating time of the timing 206 as the time integer value i+4 (time integer value of beginning end of the period i+3) as it is, and adding a 3-bit time fractional value obtained by inverting the high-order 3-bit data of the overflow point going back time 222 to the low-order bit of the time integer value. Note that the 3-bit time fractional value obtained by inverting the high-order 3-bit data of the overflow point going back time 222 is equivalent to the time from the beginning end of the period i+3 to the time of the timing 224. The time of the timing 224 obtained as described above is inputted to the phase difference detecting unit 105 as the generated clock time.

As above, the external clock time and the generated clock time are obtained with a highly accurate time which is extended by three bits on the low-order side of the time measured with reference to the operating clock, and the frequency number is obtained from the phase difference between the clocks to synchronize the generated clock with the external clock. Thus, highly accurate synchronization can be realized. 231 in FIG. 2 is a phase difference between the external clock and the generated clock which is detected with reference to the operating clock. The phase difference 231 has only a resolution determined by the operating clock, and thus the phase difference can be expressed only by a time difference in units of cycles of the operating clock. 232 is a phase difference between the external clock and the generated clock in the PLL circuit of this embodiment. This phase difference 232 is expressed in an eight-fold resolution of the resolution determined by the operating clock, and thus a highly accurate synchronization is realized.

Figure 3:
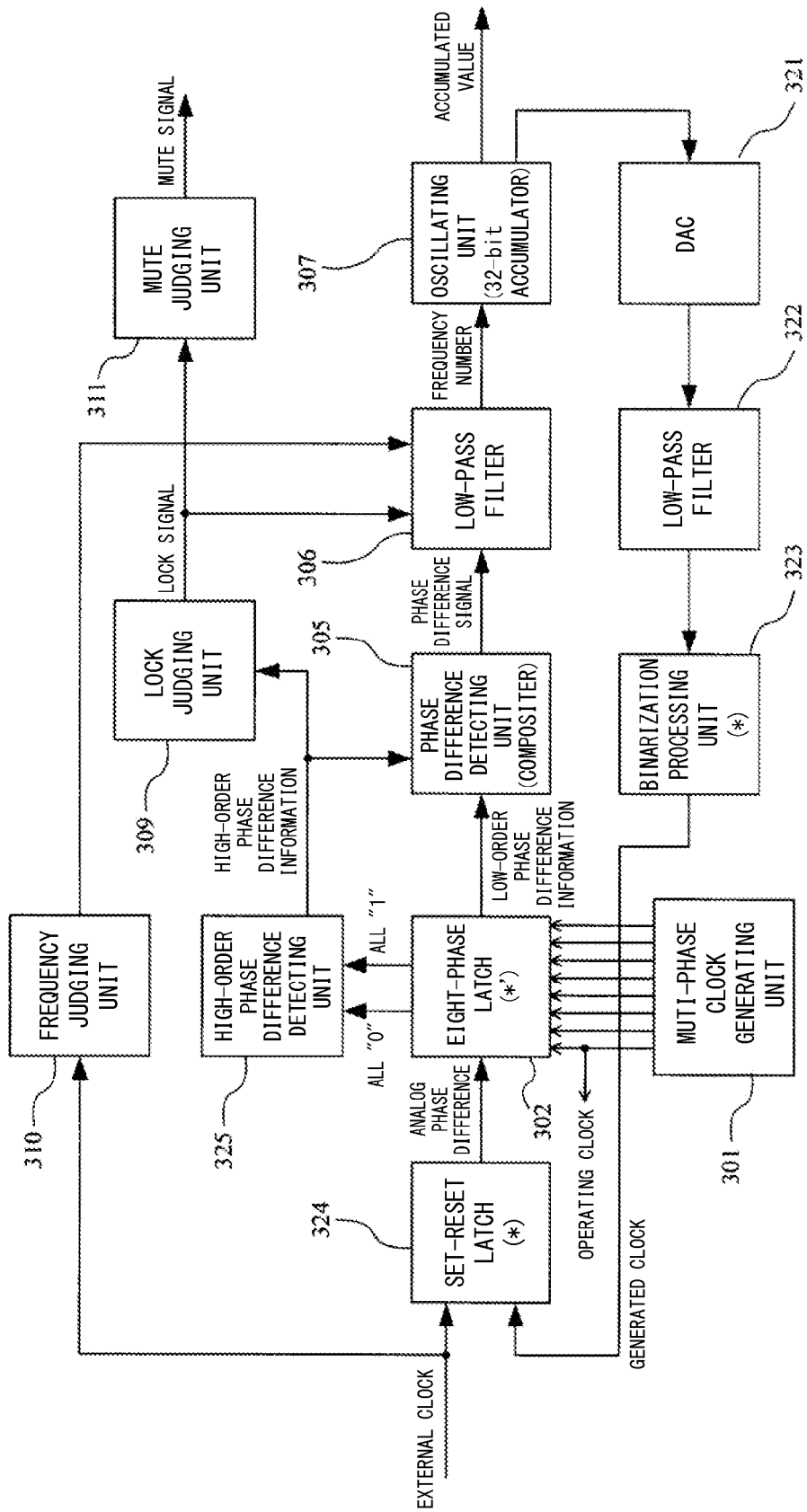
FIG. 3 is a structural diagram of a PLL circuit which is a second embodiment.
Figure 4:
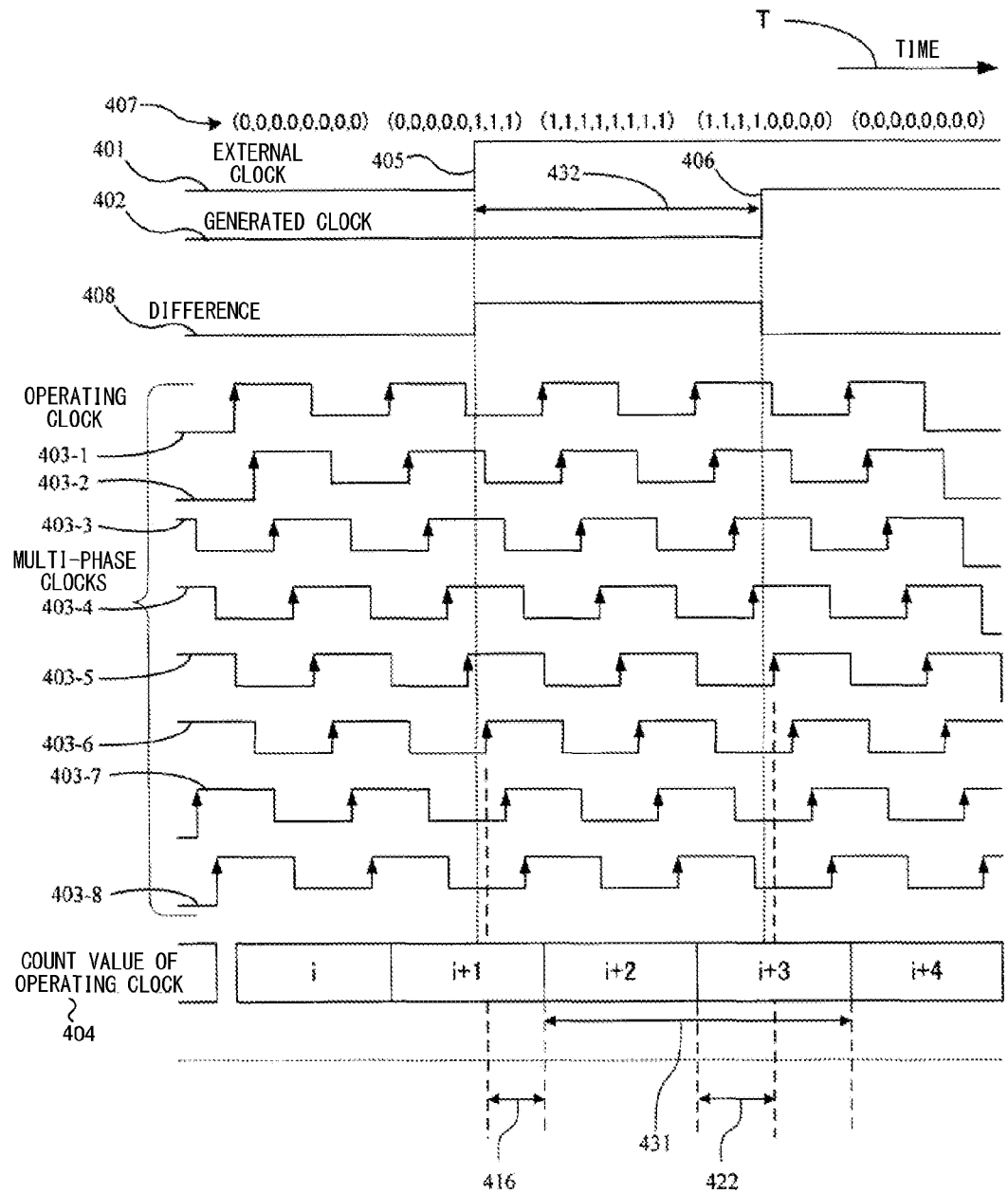
FIG. 4 is a diagram illustrating signal timings of respective parts in the PLL circuit of the second embodiment.

FIG. 3 is a structural diagram of a PLL circuit which is a second embodiment of the present invention. In this PLL circuit, part of the full-digital PLL circuit of FIG. 1 is constituted of an analog circuit. FIG. 4 is an explanatory diagram of timings of respective parts and the like in the PLL circuit of FIG. 3.

In FIG. 3, blocks indicated with "(*)" operate asynchronously with the operating clock, a part of a block indicated with "(*')" operates asynchronously with the operating clock, and all of the other digital blocks operate synchronously with the operating clock. In FIG. 3, a multi-phase clock generating unit 301 generates a multi-phase clock similarly to the multi-phase clock generating unit 101 of FIG. 1. An eight-phase latch 302 latches an input signal by the multi-phase clock similarly to the eight-phase latch 102. However, a difference (analog phase difference) outputted from an SR latch 324 which will be described later is inputted to the eight-phase latch 302, and thus an input part of the eight-phase latch 302 performs processing which does not synchronizes with the operating clock. A phase difference detecting unit 305 is the same as the phase difference detecting unit 105 of FIG. 1 in that it outputs a phase difference signal regarding an external clock and a generated clock, but different therefrom in generating method of the phase difference signal. A low-pass filter 306 outputs a frequency number based on a phase difference signal similarly to the low-pass filter 106 of FIG. 1. An oscillating unit 307 accumulates the frequency number and outputs an accumulated value of a saw-tooth waveform including the generated clock, similarly to the oscillating unit 107 of FIG. 1.

A DAC 321 converts the saw-tooth wave of the accumulated value outputted from the oscillating unit 307 into a triangular wave (conversion into a triangular wave is possible by, for example, obtaining an XOR of bits other than the most significant bit of the accumulated value with the most significant bit), and thereafter converts the triangular wave into an analog signal. The triangular wave of this analog signal is made into a smooth analog signal waveform by the low-pass filter 322, and is thereafter binarized to 0/1 based on a predetermined threshold value by a binarization processing unit 323. Thus, the generated clock can be obtained from an output of the oscillating unit 307. Note that it is not necessary to convert the saw-tooth wave into the triangular wave first and then D/A convert the resultant. The accumulated value may be converted into an arbitrary shape (such as a sine wave) using a conversion table and then D/A converted, or the saw-tooth wave as it is may be D/A converted without converting the waveform.

An SR (set-reset) latch 324 is a latch which is set to "1" when the external clock is "1", and is reset to "0" when the generated clock is "1". An output of the SR latch 324 is a signal indicating a time difference (analog phase difference) from a rising point of the external clock to a rising point of the generated clock. Specifically, the length of period in which this difference signal is "1" is a phase difference from a rise of the external clock to a rise of the generated clock, and the length of period of "0" is a phase difference from a rise of the generated clock to a rise of the external clock. Here, the former is called a positive phase difference, the latter is called a negative phase difference, and the phase difference with a smaller absolute value among them is measured here. When the frequencies of the external clock and the generated clock are so close to each other that the phase difference can be measured, sum of the absolute value of the positive phase difference and the absolute value of the negative phase difference is the cycle length (reference cycle length) corresponding to the frequency of one of the clocks or the average frequency of the clocks, and when one of the absolute values is measured, the other can be calculated.

A rising and a falling of this difference signal is latched in the eight-phase latch 302 based on the multi-phase clock from the multi-phase clock generating unit 301. When the latch result is all "0", that is, (0, 0, 0, 0, 0, 0, 0, 0) or all "1", that is, (1, 1, 1, 1, 1, 1, 1, 1), the eight-phase latch 302 outputs an all "0" signal indicating the all "0" or an all "1" signal indicating the all "1". A high-order phase difference detecting unit 325 counts lengths of period of the all "0" and period of the all "1" in every reference cycle based on the operating clock (by time resolution of the operating clock). Then, the high-order phase difference detecting unit 325 compares the measured length of the all "0" period and the measured length of the all "1" period, and outputs, when the length of the all "0" period is longer, high-order phase difference information (positive integer value) which has a positive sign and whose absolute value is the length of the all "1" period, or outputs, when the length of the all "1" period is longer, high-order phase difference information (negative integer value) which has a negative sign and whose absolute value is the length of the all "0" period. The high-order phase difference information outputted from the high-order phase difference detecting unit 325 is inputted to a lock judging unit 309 and the phase difference detecting unit 305.

Moreover, when the latch result in one cycle of the operating clock is neither all "0" nor all "1", the eight-phase latch 302 outputs 3-bit data indicating the number of "1" in the latch result to the phase difference detecting unit 305 as a low-order phase difference information. Note that the low-order phase difference information may be 3-bit data indicating the number of "0". The both are in the relation of one's complement, and basically are equivalent. Further, the continuity of "1" or "0" of the latch result may be checked here, and an error warning may be given when there is no continuity. The low-order phase difference information is outputted zero to two times in the reference cycle according to the timings of the generated clock and the external clock. In every reference cycle, the phase difference detecting unit 305 adds up one high-order phase difference information (integer value) from the high-order phase difference detecting unit 325 and zero to two low-order phase difference information (fractional values) from the eight-phase latch 302, thereby obtaining one phase difference signal. When a high-order phase difference signal is a positive integer value, a positive fractional values indicated by the zero to two low-order phase difference information are added to the positive integer value, and thereby the phase difference signal of the positive value is calculated, or when the high-order phase difference signal is a negative integer value, a negative fractional values indicated by the low-order phase difference information are added to the negative integer value, and thereby the phase difference signal of the negative value is calculated. The phase difference signal synthesized by the phase difference detecting unit 305 is inputted to the low-pass filter 306. The operations of the low-pass filter 306 and the oscillating unit 307 are similar to those in FIG. 1.

A frequency judging unit 310 operates similarly to the frequency judging unit 110 of FIG. 1. The lock judging unit 309 outputs a lock signal similar to that of lock judging unit 109 of FIG. 1, but the lock signal is for determining "0" or "1" based on the high-order phase difference information. For example, when the high-order phase difference information is continuously in the range of "−1 or more and 1 or less", it is assumed that the generated clock is in synchronization with the external clock and the lock judging unit 309 outputs the lock signal "1", or when it is not in the range, it is assumed that the generated clock is not in synchronization with the external clock, and the lock judging unit 309 outputs the lock signal "0". Note that when the high-order phase difference signal is in the range of "−1 or more and 1 or less", either one of the all "0" period length and the all "1" period length is "0". Further, the case where all "0" or all "1" continues is conceivable by that frequencies of the generated clock and the external clock differ largely, but in this case, the frequency judged in the frequency judging unit 310 does not match the value of the current frequency number. Thus, the lock signal "0" is outputted from the lock judging unit 309, and the frequency number initial value corresponding to the judged frequency is reset to the low-pass filter 306, thereby starting the operation from the frequency number of initial value. A mute judging unit 311 operates similarly to the mute judging unit 111 of FIG. 1.

With reference to a timing diagram of FIG. 4, timings of respective signals in the PLL circuit of the second embodiment of FIG. 3 will be described.

An arrow T denotes an elapsing direction of time. 401 denotes the external clock, and 402 denotes the generated clock. 403-1 to 403-8 denote the eight clocks in the multi-phase clocks generated by the multi-phase clock generating unit 301 in the order of first to eighth clocks. 403-1 is the operating clock. 404 denotes a count value of the operating clock counter. 405 is a rising timing of the external clock, and 406 is a rising timing of the generated clock.

408 denotes the difference signal (analog phase difference) outputted by the SR latch 324. This difference signal is set to "1" at the rising timing 405 of the external clock 401, and is reset to "0" at the rising timing 406 of the generated clock 402. 407 denotes in order the latch result of the difference signal 408 by the eight-phase latch 302 in period i, the latch result of the difference signal 408 by the eight-phase latch 302 in period i+1, and so on. In the period i+1, the difference signal 408 rises to "1" between the rise of the fifth clock and the rise of the sixth clock among the multi-phase clocks, and thus the latch result is (0, 0, 0, 0, 0, 1, 1, 1). In the period i+2, the difference signal 408 is constantly "1", and thus the latch result is (1, 1, 1, 1, 1, 1, 1, 1). In the period i+3, the difference signal 408 falls to "0" between the rise of the fourth clock and the rise of the fifth clock among the multi-phase clocks, and thus the latch result is (1, 1, 1, 1, 0, 0, 0, 0).

In the period in which the difference signal 408 is "1", the cycle of the operating clock for which the latch result by the eight-phase latch 302 is all "1" is only one cycle of the period i+2. Therefore, the high-order phase difference detecting unit 325 judges that length of the all "0" period is longer than length of the all "1" period, and outputs the counted length "1" of the all "1" period as the high-order phase difference information (positive integer value). Further, at the timing of starting end of the period i+2, based on the latch result (0, 0, 0, 0, 0, 1, 1, 1) of the period i+1, the eight-phase latch 302 generates the low-order phase difference information (representing the time denoted by 416) with a value "⅜" (011B) and outputs it to the phase difference detecting unit 305. Further, at the timing of starting end of the period i+4, based on the latch result (1, 1, 1, 1, 0, 0, 0, 0) of the period i+3, the eight-phase latch 302 generates the low-order phase difference information (representing the time denoted by 422) with a value "4/8" (100B) and outputs it to the phase difference detecting unit 305. The phase difference detecting unit 305 adds up the inputted high-order phase difference information "1" and the low-order phase difference information "⅜" and "4/8" (both are positive values), thereby obtains the phase difference information (corresponding to the phase difference 432) with a value "1+⅞", and outputs it to the low-pass filter 306.

The case where the length of the all "0" period is longer than the length of the all "1" period is described above, but the same applies to the case where the length of the all "1" period is longer than the length of the all "0" period. For example, in FIG. 4, the case where 402 is read as the external clock and 401 is read as the internal clock, and the output of the SR latch 324 is "0" only in period 432 (replacing "0" and "1" in the difference signal 408), may be assumed. In this case, the high-order phase difference detecting unit 325 judges that the all "1" period is longer than the all "0" period, and outputs "−1" obtained by converting the counted length "1" of the all "0" period into a negative value as the high-order phase difference information (negative integer value). Further, the eight-phase latch 302 outputs the low-order phase difference information with a value of "⅝" (101B) and that with a value of "4/8" (100B) respectively at timings of respective beginning ends of the periods i+2 and i+4. The phase difference detecting unit 305 adds up the high-order phase difference information "−1" and the low-order phase difference information "−⅜" and "−4/8" (each converted into negative values) to the obtain phase difference information with a value "−1−⅞", and outputs it to the low-pass filter 306.

In the above second embodiment, the length of the period in which the difference signal 408 is "1" (phase difference between the external clock and the generated clock) is obtained in resolution with high accuracy extended by three bits on the low-order side from the time measured with reference to the operating clock is obtained, the frequency number is obtained from the phase difference thereof, and the generated clock is synchronized with the external clock using the obtained phase difference. Thus, highly accurate synchronization can be realized. 431 in FIG. 4 is a phase difference between the external clock and the generated clock detected with reference to the operating clock. Since there is only a resolution determined by the operating clock, the phase difference can only be expressed by a time difference in units of cycles of the operating clock. 432 is a phase difference between the external clock and the generated clock in the PLL circuit of the second embodiment. This phase difference 432 is expressed in 8-time resolution of the resolution determined by the operating clock, and thus more accurate synchronization is realized.

Figure 5:
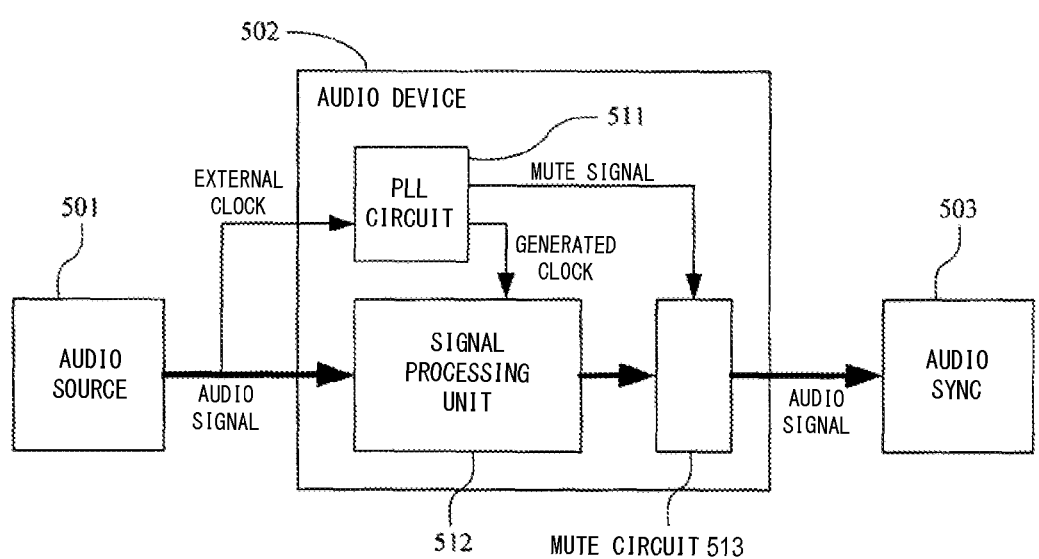
FIG. 5 is an overall diagram of an audio device to which the PLL circuits of the embodiments are applied.

FIG. 5 is an overall diagram of an audio device to which the PLL circuits of the first and second embodiments are applied.

501 is an audio source outputting a digital audio signal in synchronization with a sampling clock, and the outputted audio signal is accompanied by this sampling clock. For example, it is an A/D convertor which converts an analog audio signal from a microphone or the like into digital and outputs the converted signal, a reproducer which reproduces a recorded digital audio signal, or the like. 502 is an audio device which performs various signal processing on an audio signal received from the audio source 501 and outputs the processed audio signal. 503 is an audio sync which receives an audio signal outputted from the audio device 502 and is, for example, a device which DA converts the received audio signal and outputs sounds via a speaker or a headphone.

The audio device 502 has the PLL circuit 511 of the first or second embodiment described above. To the PLL circuit 511, the sampling clock accompanying the audio signal is inputted as an external clock, and a generated clock following this external clock is outputted. Further, from the PLL 511, a mute signal of "1" is outputted when the phase of the generated clock is not yet in stable synchronization with the external clock (lock signal "0"), or a mute signal of "0" is outputted when it is in stable synchronization therewith (lock signal "1"). A signal processing unit 512 performs various types of signal processing in synchronization with the generated clock from the PLL circuit 511. A mute circuit 513 mutes the audio signal from the signal processing unit 512 when the mute signal is "1", and let through the audio signal from the signal processing unit 512 when the mute signal is "0" and outputs it to the audio sync 503. When the lock is on (lock signal "1") and the audio signal is in accurate synchronization with the generated clock, a trouble such as noise does not occur even when the signal processing unit 512 performs signal processing on the audio signal as it is without performing sampling frequency conversion. In this case, the mute signal is "0", and the audio signal outputted from the signal processing unit 512 passes through the mute circuit 513 and is supplied to the audio sync 503. On the other hand, when the lock is released (lock signal "0"), the audio signal of the signal processing unit 512 contains noise, and thus the mute signal is set to "1", thereby blocking supply of the audio signal to the audio sync 503.

Note that in the above-described embodiments, accurate times are calculated in 8-fold resolution from the time position obtained with reference to the operating clock, but this calculation method is arbitrary. In short, any calculation method can be adopted as far as times obtained in resolution with reference to the operating clock and times obtained in 8-fold resolution from the latch results of the eight-phase latch 102, 302 are used to calculate times accurately. Further, the above-described embodiments are described with the cases where one cycle of the operating clock is divided into eight and the resolution is 8 fold (extended by three bits on the low-order side), but how many periods the cycle is divided into and how high the resolution is increased are arbitrary. It may be divided into four and extended by two bits on the low-order side, or divided into 16 and extended by four bits on the low-order side. Further, it is not absolutely necessary to divide into a power-of-two number, and for example, it may be structured to divide into ten and have a 10-fold resolution.

In the embodiments, examples of operations with reference to rising timings of each clock are described, but falling timings may be utilized instead of the rising timings.

In the embodiments, the "frequency signal generating unit which outputs a frequency number (frequency signal) based on a phase difference signal" is structured by the low-pass filter 106 or 306, but the structure of the frequency signal generating unit is not limited to this. Any processing block may be employed as far as it is a structure capable of providing a feedback corresponding to the phase difference signal and generating a frequency signal which does not rapidly change in value. Further, the oscillating unit is not limited to the oscillating unit 107 or 307 (32-bit accumulator) in the embodiments. It may be an accumulator having an arbitrary number of bits which can realize desired accuracy. Further, it may be structured such that an overflow of the accumulator occurs by a smaller predetermined value than the largest value according to its bit number. Further, the accumulator accumulates a positive frequency number in the embodiments, but it may be an accumulator which accumulates a negative value in which the accumulated value decreases gradually. An overflow in this case may occur at a point when the accumulated value becomes smaller than "0".

REFERENCE SIGNS LIST

101 . . . multi-phase clock generating unit, 102 . . . eight-phase latch, 103 . . . operating clock counter, 104 . . . intermediate bit latch, 105 . . . phase difference detecting unit, 106 . . . low-pass filter, 107 . . . oscillating unit, 108 . . . generated clock time calculating unit, 109 . . . lock judging unit, 110 . . . frequency judging unit, 111 . . . mute judging unit

The invention claimed is:

1. A PLL circuit that operates in synchronization with an operating clock and generates and outputs a generated clock in synchronization with an external clock, which is an inputted clock signal having substantially constant cycles, the PLL circuit comprising:
  a multi-phase clock generating unit that generates multi-phase clocks including n clocks which have a same first frequency and each of which differs in phase from one another, one of the n clocks included in the multi-phase clocks being the operating clock;
  a frequency signal generating unit that outputs a frequency signal based on a phase difference signal from a phase comparator;
  an oscillating unit that generates and outputs the generated clock oscillating with a second frequency corresponding to the frequency signal, wherein the first frequency of the operating clock is larger than the second frequency of the generated clock; and
  the phase comparator that measures, based on the n clocks included in the multi-phase clocks, a time difference, wherein the time difference is measured between a rising time of the inputted external clock and a rising time of the generated clock generated in the oscillating unit or between a falling time of the inputted external clock and a falling time of the generated clock generated in the oscillating unit, and outputs the phase difference signal indicating the time difference, wherein n is an integer number.

2. The PLL circuit according to claim 1,
  wherein the phase comparator converts a waveform including the generated clock generated in the oscillating unit into an analog signal, and measures the time difference using a binarized clock obtained by binarizing the analog signal.

3. The PLL circuit according to claim 1,
  wherein the phase comparator measures a first timing, including the rising or falling timing of the external clock based on the n clocks included in the multi-phase clocks, measures a second timing, including the rising or falling timing of the generated clock based on an accumulated value at a time when the generated clock is generated in the oscillating unit, and obtains the time difference from a difference between the first and second timings.

4. The PLL circuit according to claim 1 further comprising a counter that counts one or more timings of the operating clock, generating a count value,
wherein the phase comparator measures the time difference by determining a first value of a first resolution based on the count value of the counter and determining a second value of a second resolution based on the n clocks in the multi-phase clocks, wherein the second resolution is higher than the first resolution, and wherein the time difference is expressed based on the first value and the second value.

5. The PLL circuit according to claim 2 further comprising a counter that counts one or more timings of the operating clock, generating a count value,
wherein the phase comparator measures the time difference by determining a first value of a first resolution based on the count value of the counter and determining a second value of a second resolution based on the n clocks included in the multi-phase clocks, wherein the second resolution is higher than the first resolution, and wherein the time difference is expressed based on the first value and the second value.

6. The PLL circuit according to claim 1 further comprising a counter that counts one or more timings of the operating clock, generating a count value,
wherein the phase comparator measures the time difference by determining a first value that represents a high-order of the time difference based on the count value of the counter and determining a second value that represents a low-order of the time difference based on the n clocks included in the multi-phase clocks, wherein the time difference is expressed based on the first value and the second value.

7. The PLL circuit according to claim 2 further comprising a counter that counts one or more timings of the operating clock, generating a count value,
wherein the phase comparator measures the time difference by determining a first value that represents a high order of the time difference based on the count value of the counter and determining a second value that represents low order of the time difference based on the n clocks included in the multi-phase clocks, wherein the time difference is expressed based on the first value and the second value.

8. A PLL circuit that operates in synchronization with an operating clock and generates and outputs a generated clock in synchronization with an external clock, which is an inputted clock signal having substantially constant cycles, the PLL circuit comprising:
a multi-phase clock generating unit that generates multi-phase clocks including n clocks which have a same first frequency and each of which differs in phase one from another, one of the n clocks included in the multi-phase clock being the operating clock;
a frequency number signal generating unit that outputs values of a frequency number, each value based on a phase difference signal from a phase comparator;
an oscillating unit that accumulates the values of the frequency number at respective timings of the operating clock into an accumulated value, wherein the oscillating unit, based on the accumulated value, generates and outputs the generated clock oscillating with a second frequency corresponding to the frequency number, wherein the first frequency of the operating clock is larger than the second frequency of the generated clock; and
the phase comparator that measures, based on the n clocks included in the multi-phase clocks, a time difference, wherein the time difference is measured between a rising time of the inputted external clock and a rising time of the generated clock generated in the oscillating unit or between a falling time of the inputted external clock and a falling time of the generated clock generated in the oscillating unit, and outputs the phase difference signal indicating the time difference expressed with time accuracy of n-fold of the operating clock, wherein n is an integer number.

9. The PLL circuit according to claim 8,
wherein the phase comparator converts a waveform including the generated clock generated in the oscillating unit into an analog signal, and measures the time difference using a binarized clock obtained by binarizing the analog signal.

10. The PLL circuit according to claim 8,
wherein the phase comparator measures a first timing, including the rising or falling timing of the external clock based on the n clocks included in the multi-phase clocks, measures a second timing, including the rising or falling timing of the generated clock based on the accumulated value at a time when the generated clock is generated in the oscillating unit, and obtains the time difference from a difference between the first and second timings.

* * * * *